(12) United States Patent
Minoda et al.

(10) Patent No.: US 8,274,292 B2
(45) Date of Patent: Sep. 25, 2012

(54) CELL VOLTAGE DETECTING SYSTEM AND DRIVE VOLTAGE MAINTAINING METHOD

(75) Inventors: Yuji Minoda, Saitama (JP); Toshiaki Ariyoshi, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 331 days.

(21) Appl. No.: 12/692,167

(22) Filed: Jan. 22, 2010

(65) Prior Publication Data

US 2010/0188093 A1 Jul. 29, 2010

(30) Foreign Application Priority Data

Jan. 23, 2009 (JP) ................................. 2009-013169

(51) Int. Cl.
*G01N 27/416* (2006.01)
*H01M 10/44* (2006.01)
*H02J 7/00* (2006.01)

(52) U.S. Cl. ......... 324/427; 320/101; 320/116; 320/162
(58) Field of Classification Search .................... 324/427
See application file for complete search history.

(56) References Cited

U.S. PATENT DOCUMENTS

| 8,058,842 B2 * | 11/2011 | Kai et al. | 320/116 |
| 2002/0196025 A1 * | 12/2002 | Freeman et al. | 324/426 |
| 2005/0007068 A1 * | 1/2005 | Johnson et al. | 320/110 |
| 2005/0068002 A1 | 3/2005 | Ozeki | |
| 2008/0284375 A1 * | 11/2008 | Nagaoka et al. | 320/116 |

FOREIGN PATENT DOCUMENTS

| JP | 7-335273 | 12/1995 |
| JP | 10-322922 | 12/1998 |
| JP | 2000-356656 | 12/2000 |
| JP | 2004-265787 | 9/2004 |
| JP | 2007-42501 | 2/2007 |
| JP | 2007-66643 | 3/2007 |
| JP | 2007-232417 | 9/2007 |
| JP | 2007-336795 | 12/2007 |

OTHER PUBLICATIONS

Japanese Office Action for Application No. 2009-013169, dated Apr. 26, 2011.
European Office Action for Application No. 10151382.8, dated May 4, 2010.

* cited by examiner

*Primary Examiner* — Drew A Dunn
*Assistant Examiner* — Nathaniel Pelton
(74) *Attorney, Agent, or Firm* — Nelson Mullins Riley & Scarborough LLP; Anthony A. Laurentano

(57) ABSTRACT

In a cell voltage detecting system detecting cell voltages of a fuel cell connected in series, a voltage detector detects cell voltages. An auxiliary power supply generates a voltage equal to or greater than a minimum voltage for driving the voltage detector at positive and negative terminals thereof. First and second diodes are connected to a positive drive terminal of the voltage detector to supply the power to the drive terminal of the voltage detector from a high voltage side between the fuel cell or the auxiliary power supply. A negative terminal of the fuel cell, the negative drive terminal, and the negative terminal of the auxiliary power supply are connected to have a same potential. A method of maintaining a drive voltage for the voltage detector is also disclosed in which the drive voltage for the voltage detector is supplied from the high voltage side.

6 Claims, 2 Drawing Sheets

CELL VOLTAGE DETECTING SYSTEM AND DRIVE VOLTAGE MAINTAINING METHOD

CROSS REFERENCE TO RELATED APPLICATIONS

This application claims the foreign priority benefit under Title 35, United States Code, §119(a)-(d) of Japanese Patent Application No. 2009-013169, filed on Jan. 23, 2009 in the Japan Patent Office, the disclosure of which is herein incorporated by reference in its entirety.

BACKGROUND OF THE INVENTION

1. Field of the Invention

The present invention relates to a cell voltage detecting system for a fuel cell and a drive voltage maintaining method for a voltage detector.

2. Description of the Related Art

A cell voltage detecting system for detecting cell voltages in a battery cell stack including a plurality of cells such as fuel cells is known.

Fuel cells are generally used in a form of a fuel stack including a plurality of cells connected in series, each cell generating an emf through an electrochemical reaction between a fuel gas mainly containing hydrogen and an oxidizing gas. Such fuel cells are installed, for example, in a fuel cell vehicle.

Cell voltages tend to vary depending on a fuel gas density, a temperature, and a temperature distribution in the fuel cell stack. For example, the cell voltages of the fuel cell are zero volts when the fuel gas is not supplied to the fuel cell. Further, decrease in cell voltages of a part of cells in the fuel cell stack may influence the whole of the fuel stack in a life and a stability of the fuel stack. Accordingly, it is required to monitor (detect) a status of each cell voltage in the fuel cell stack.

JP 2007-232417 A discloses at paragraph 0006 a cell voltage detecting system using an A/D converter as a voltage detector for detecting a cell voltage. The cell voltage detecting system disclosed in JP 2007-232417 A uses the fuel cell itself as a power supply for driving the voltage detector. However, as mentioned above, the voltage of the fuel cell may largely vary. Thus, with variation of the voltage of the fuel cells a voltage detection error may occur. In the cell voltage detecting system disclosed in JP 2007-232417 A, a monitoring circuit for monitoring a voltage for driving the voltage detector and an external power supply for driving the monitoring circuit are additionally provided.

SUMMARY OF THE INVENTION

A first aspect of the present invention provides a cell voltage detecting system that detects voltages of cells in a fuel cell connected in series, comprising: a voltage detector that detects voltages of the cells and includes positive and negative drive terminals; an auxiliary power supply that generates a voltage equal to or greater than a minimum voltage necessary for driving the voltage detector between positive and negative terminals thereof; a first diode connected to a positive terminal of the fuel cell and the positive drive terminal in such a direction as to allow a current to flow therethrough from the positive terminal of the fuel cell to the positive drive terminal; and a second diode connected to the positive terminal of the auxiliary power supply and the positive drive terminal in such a direction as to allow a current to flow therethrough from the positive terminal of the auxiliary power supply to the positive drive supply terminal, wherein a negative terminal of the fuel cell, the negative drive terminal, and the negative terminal of the auxiliary power supply are connected to have a same potential.

According to this structure, although the output voltage of the fuel cell becomes lower than the minimum voltage necessary for driving the voltage detector, the drive voltage supplied to the voltage detector may be kept equal to or greater than the minimum drive voltage for the voltage detector. This may provide stable voltage detection. Further, the first and second diodes can switch one to another power supply for the voltage detector which outputs a higher voltage between the output voltage of the fuel cell and the output voltage of the auxiliary power supply. This may eliminate necessity of determining whether the output voltage of the fuel cell decreases. This may makes the system size more compact. Further, this structure may eliminate necessity of an additional circuit for determining whether the output voltage of the fuel cell decreases, and thus suppress a cost.

A second aspect of the present invention provides a cell voltage detecting system based on the first aspect, wherein the auxiliary power supply comprises an external power supply for generating an output voltage and a DC-DC converter, wherein the output voltage of the auxiliary power supply is smaller than an output voltage of the external power supply.

According to the structure, the output voltage of the auxiliary power supply may be smaller than the output voltage of the external power supply, such as a battery of 12V. This may eliminate necessity of a boost circuit, which miniaturizes a circuit size of the cell voltage detecting system.

A third aspect of the present invention provides a cell voltage detecting system based on the second aspect, wherein the cells are divided into a plurality of blocks as the cells are connected in series, each block including a negative terminal; the DC-DC converter comprises a plurality of isolated DC-DC converting devices that belong to respective blocks, each of the isolated DC-DC converting devices including primary and secondary sides isolated, including the negative terminal of the DC-DC converter on the secondary side, and generating the voltage between the positive and negative terminals on the secondary side; and the voltage detector comprising a plurality of voltage detecting devices that belong to respective blocks, each detecting voltages of the cells in the block and including the positive and negative drive terminals. The negative terminal on the secondary side of the isolated DC-DC converting device, and the negative drive terminal of the voltage detecting device in the block are equalized to a potential of the negative terminal of the block, and the primary side in each block is connected to the auxiliary power supply.

According to this structure, the voltage detector and the insulated DC-DC converting device may be provided at each block, and a voltage potential of a negative terminal of the block, a negative terminal of the voltage detecting devices, and a negative terminal on the secondary side of the insulated DC-DC converting devices are made equal. This may decrease the number of the external voltage sources for supplying power to the insulated DC-DC converter to one.

Accordingly, this case can make the circuit size more compact than the case where the external power supplies are provided at respective blocks because the number of the external power supplies can be decreased to one.

A fourth aspect of the present invention provides a method of maintaining a drive voltage for a cell voltage detector that detects voltages of cells in a fuel cell connected in series, using voltages of the fuel cell and an auxiliary power supply, the method comprising the steps of: supplying a voltage of the fuel cell to the cell voltage detector when the voltage of the fuel cell is greater than the voltage of the auxiliary power supply; and supplying the voltage of the auxiliary power supply to the cell voltage detector when the voltage of the fuel cell is not greater than the voltage of the auxiliary power supply.

A fifth aspect of the present invention provides the method according to the fourth aspect, further comprising the steps of: (a) determining the voltage of the auxiliary power supply to be equal to or greater than a minimum voltage necessary for driving the voltage detector between positive and negative terminals thereof; and (b) when an output voltage of the fuel cell is greater than the minimum voltage, supplying the voltage of the fuel cell to the voltage detector and when the voltage of the fuel cell is not greater than the minimum voltage, supplying the voltage of the auxiliary power supply to the voltage detector.

A sixth aspect of the present invention provides the method according to the fifth aspect, wherein the step (b) comprising the steps of: providing a first diode connected to a positive terminal of the fuel cell and a positive drive terminal of the voltage detector in such a direction as to allow a current to flow therethrough from the positive terminal of the fuel cell to the positive drive terminal of the voltage detector; and a second diode connected to the positive terminal of the auxiliary power supply and the positive drive terminal in such a direction as to allow a current to flow therethrough from the positive terminal of the auxiliary power supply to the positive drive supply terminal; and connecting a negative terminal of the fuel cell, a negative drive terminal of the voltage detector, and a negative terminal of the auxiliary power supply each other to have a same potential.

A seventh aspect of the present invention provides the method according to the fifth aspect, wherein the auxiliary power supply comprises an external power supply for generating an output voltage and a DC-DC converter, the method further comprising the step of determining that the output voltage of the auxiliary power supply is smaller than an output voltage of the external power supply.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Prior to describing embodiments of the present invention, the above-mentioned related art will be further explained.

In the cell voltage detecting system disclosed in JP 2007-232417 A, because the monitoring circuit and the power supply driving the monitoring circuit are additionally provided, the circuit size may become large with a high cost. Moreover, when the monitoring circuit determines that a voltage of the fuel cell for driving the voltage detector (an A/D converter) decreases to an error extent, accuracy in detecting the cell voltage will decrease, which may cause a trouble in stable operation of the fuel cell. In other words, it is better to avoid excessive decrease in the drive voltage rather than monitoring.

The present invention provides a cell voltage detecting system having a compact circuit structure in which the voltage detector for detecting a cell voltage is driven by the fuel cell itself as well as detecting the cell voltage even in a low voltage status of the fuel cell.

This cell voltage detecting system can detect the cell voltage stable even in the low voltage status of the fuel cell.

With reference to drawings will be described embodiments of the present invention in detail.

[First Embodiment]

Figure 1:
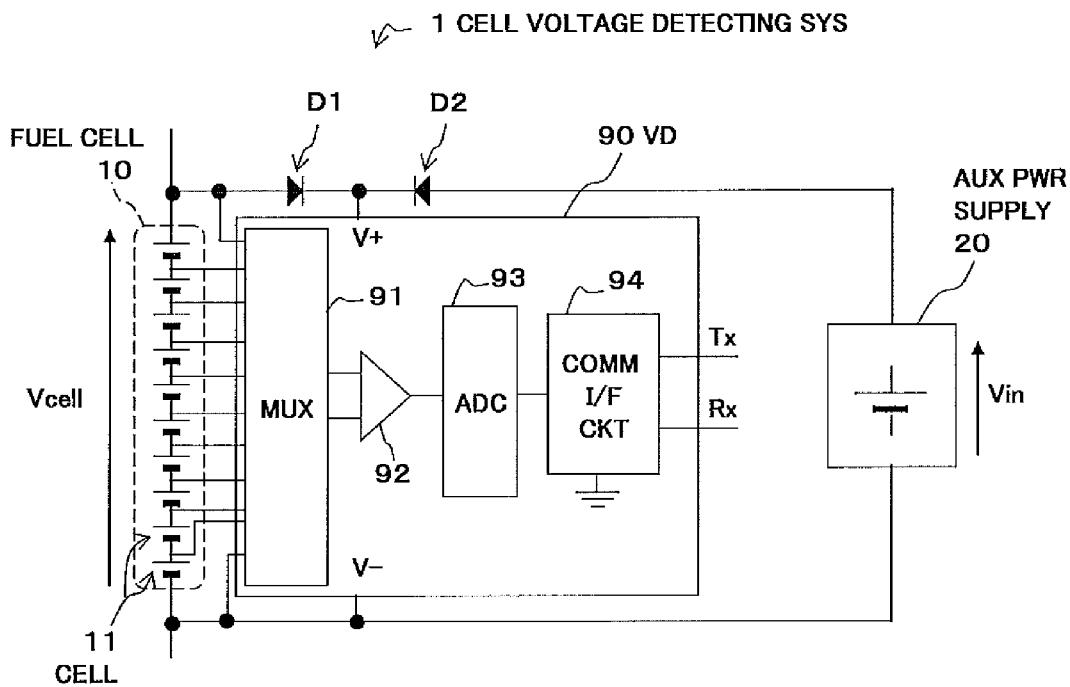
FIG. 1 is a block diagram of an example of a cell voltage detecting system according to a first embodiment of the present invention.

With reference to FIG. 1 will be described an example of the cell voltage detecting system and a method of maintaining a drive voltage, according to a first embodiment.

As shown in FIG. 1, the cell voltage detecting system 1 includes a voltage detector 90, an additional power supply 20, and diodes D1 and D2 to detect cell voltages in the fuel cell 10.

The fuel cell 10 includes a plurality of single batteries 11, i.e., cells, connected in series. The cell 11 of the fuel cell 10 has a terminal for detecting a potential of the cell at a positive electrode thereof (a separator for separating one cell from another cell), and the cell 11 at the lowest potential further includes a negative terminal. An output voltage Vcell of the fuel cell 10 varies depending on a fuel gas density, a temperature, a humidity, and a temperature distributions inside the fuel cell 10. FIG. 1 shows the example in which ten cells 11 are connected in series. However, the number of the cells 11 is not limited to ten. Further, the cell 11 may be a package including more than one cell.

Connected to a terminal $V^+$ for receiving a power to drive the voltage detector 90 are a diode D1 in such a direction that the diode D1 allows a current to flow from the positive terminal of the fuel cell 10 to the terminal $V^+$ and a diode D2 in such a direction that the diode D2 allows a current to flow from a positive terminal of the auxiliary power supply 20 to the terminal $V^+$. The negative drive terminal $V^-$ of the voltage detector 90 and negative terminals of the fuel cell 10 and the auxiliary power supply 20 are connected to each other to have the same potential.

The auxiliary power supply 20 generates a voltage Vin equal to or higher than a minimum drive voltage necessary for driving the voltage detector 90. Further, variation in an output voltage Vin of the auxiliary power supply 20 is very lower than an output voltage Vcell of the fuel cell 10.

Figure 2:
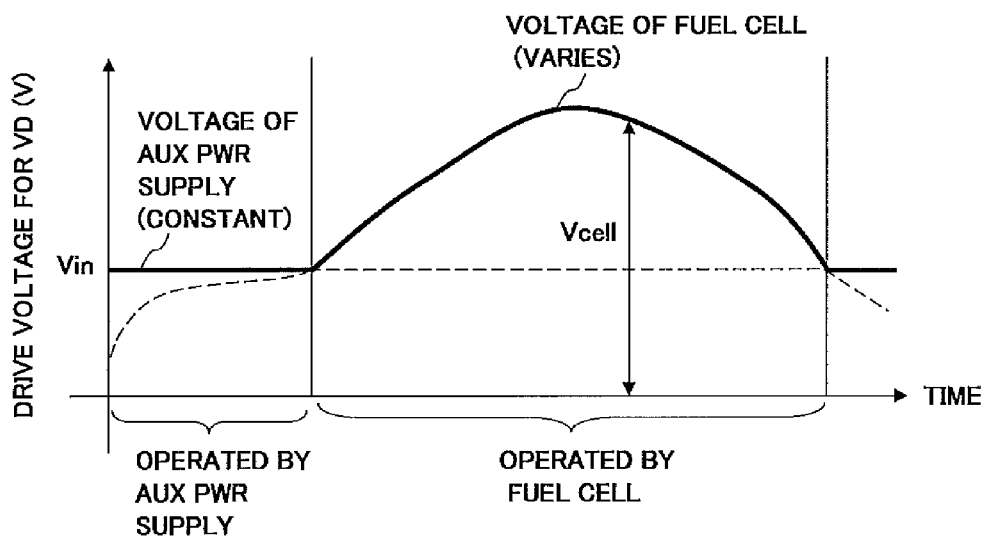
FIG. 2 is a chart showing an example of variation in a driving voltage for a voltage detector according to the present invention.

FIG. 2 shows an example of variation in the driving voltage for the voltage detector 90. An axis of abscissa in FIG. 2 represents time, and an axis of ordinate represents the drive voltage for the voltage detector 90. As shown by a thick line in FIG. 2, either of the output voltage of the fuel cell 10 or the output voltage of the auxiliary power supply 20 which has a higher output voltage is supplied to the voltage detector 90 as the drive voltage for the voltage detector 90. In other words, since during a start up operation of the fuel cell 10, the output voltage of the fuel cell 10 is lower than the output voltage of the auxiliary power supply 20, the voltage detector 90 operates with power from the auxiliary power supply 20. When the output voltage of the fuel cell 10 is higher than the output voltage of the auxiliary power supply 20, the voltage detector 90 is operated with the power from the fuel cell 10. Further when the output voltage of the fuel cell 10 becomes lower than the output voltage of the auxiliary power supply 20 again, the voltage detector 90 is operated by the power from the auxiliary power supply 20. More specifically, the drive voltage for the voltage detector 90 is generally supplied by the fuel cell 10, but when the output voltage of the fuel cell 10 is temporarily lower than a minimum drive voltage, the drive voltage for the voltage detector 90 is supplied by the auxiliary power supply 20. In addition, the drive voltage for the voltage detector 90 is generally supplied by the auxiliary power supply 20, when the fuel cell 10 starts up. In other words, the drive voltage for the voltage detector 90 is supplemented with the power from the auxiliary power supply 20.

In FIG. 1, the voltage detector 90 includes an MUX (Multiplexer) 91, a differential amplifier 92, an A/D Converter (Analog to Digital Converter) 93, and a communication I/F (Interface) circuit 94. The voltage detector 90 measures respective voltages of the cells 11 with the A/D converter 93.

The MUX 91 selects a positive terminal of one of the cells 11 forming the fuel cell 10 to detect a potential of the selected positive terminal and applies the obtained potential to the differential amplifier 92. The voltage detector 90 includes a control circuit for selecting the positive terminal. However, in FIG. 1, the control circuit for selecting the positive terminal with the MUX 91 is omitted.

The differential amplifier 92 calculates a voltage difference between the voltage potential of the selected positive terminal of the cell 11 and a reference potential (negative terminal of the voltage detector 90 and a negative terminal of the fuel cell 10) and multiplies the difference by a predetermined value.

The A/D converter 93 converts the output signal of the differential amplifier 92 into a digital signal.

The I/F circuit 94 transmits the digital signal outputted by the A/D converter 93 is transmitted to a processor (not shown) such as a microcomputer. The processor monitors the cell voltages using the received digital signal.

The voltage detector 90 further includes a voltage booster (not shown) to boost the supplied drive voltage to detect the output voltage Vcell.

As mentioned above, the cell voltage detecting system according to the first embodiment, the drive voltage for the voltage detector 90 is supplied from either the output voltage of the fuel cell 10 or the output voltage of the auxiliary power supply 20 which has a higher voltage. Accordingly, the cell voltage detecting system 1 according to the first embodiment eliminates necessity of a determining circuit for determining decrease in the output voltage Vcell of the fuel cell. Thus, the circuit size of the cell voltage detecting system 1 according to the first embodiment can be miniaturized.

Will be described the method of maintaining a drive voltage V+ for the cell voltage detector 90 that detects voltages of cells Vcell in the fuel cell 10 connected in series, using voltages of the fuel cell and the auxiliary power supply 20, the method comprising the steps of:

supplying the voltage of the fuel cell 10 to the cell voltage detector 90 when the voltage of the fuel cell is greater than the voltage of the auxiliary power supply; and supplying the voltage of the auxiliary power supply 20 to the cell voltage detector 90 when the voltage of the fuel cell 10 is not greater than the voltage of the auxiliary power supply 20.

The method may further comprise the steps of:
(a) determining the voltage of the auxiliary power supply 20 to be equal to or greater than a minimum voltage necessary for driving the voltage detector nd negative terminals thereof; and
(b) when an output voltage of the fuel cell is greater than the minimum voltage, supplying the voltage of the fuel cell 10 to the voltage detector 90 and when the voltage of the fuel cell 10 is not greater than the minimum voltage, supplying the voltage of the auxiliary power supply 20 to the voltage detector 90.

In the method, the step (b) may comprises the steps of: providing a first diode D1 connected to the positive terminal of the fuel cell 10 and the positive drive terminal V+ of the voltage detector 90 in such a direction as to allow a current to flow therethrough from the positive terminal of the fuel cell to the positive drive terminal of the voltage detector 90; and the second diode D2 connected to the positive terminal of the auxiliary power supply 20 and the positive drive terminal V+ in such a direction as to allow a current to flow therethrough from the positive terminal of the auxiliary power supply 20 to the positive drive supply terminal V+; and connecting a negative terminal of the fuel cell 10, a negative drive terminal V− of the voltage detector 90, and a negative terminal of the auxiliary power supply 20 each other to have a same potential.

[Second Embodiment]

Figure 3:
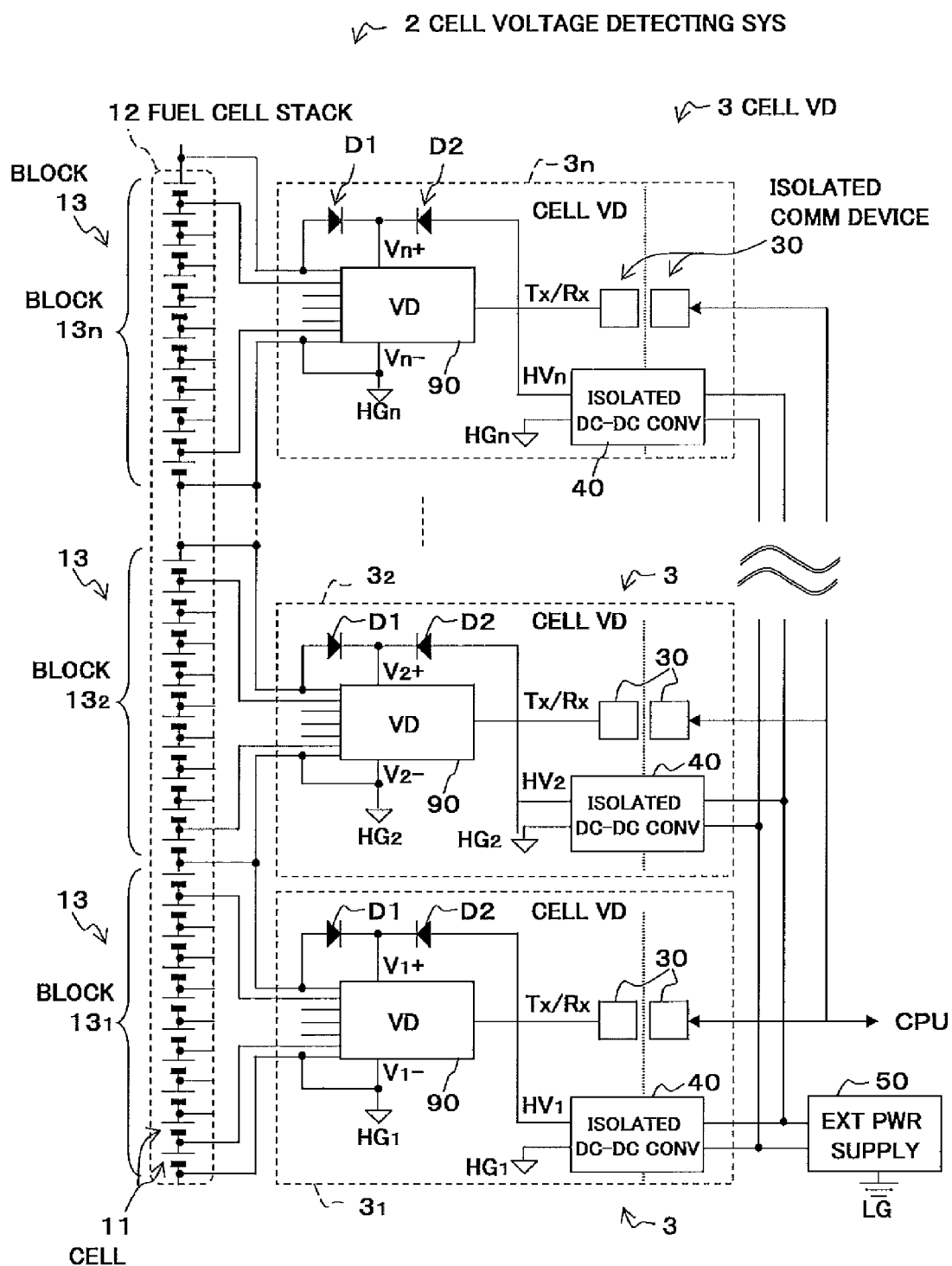
FIG. 3 is a block diagram of an example of a cell voltage detecting system according to a second embodiment of the present invention.

With reference to FIG. 3, will be described an example of the cell voltage detecting system and a method of maintaining a drive voltage according to the second embodiment. In FIG. 3, the cells 11, the diodes D1 and D2, and the voltage detector (voltage detecting device) 90 are the same as those shown in FIG. 1, thus designated with the same references, and detailed descriptions will be omitted.

As shown in FIG. 3, the cell voltage detecting system 2 according to the second embodiment includes a fuel cell stack 12, cell voltage detectors 3 ($3_1$, $3_2$, - - -, and $3_n$; n is a natural number), and an external power supply 50.

The fuel cell stack 12 includes one or more blocks 13 ($13_1$ to $13_n$), n being a natural number. The blocks 11, each of the blocks including a plurality of cells 11 connected in series, are connected in series to form the fuel cell stack 12. Cell voltage detectors 3 are provided for blocks 13 of the fuel cell stack 12, respectively. The cell voltage detector 3 in each block detects the potentials of each cell in the block 13 of the fuel cell stack 12 and transmits the detected voltage to a CPU (central processing unit). The external power supply 50 supplies such a voltage as to operate the voltage detectors 90 to the respective cell voltage detectors 3.

FIG. 3 shows the example in which ten cells 11 are connected in series. However, the number of the cells 11 is not limited to this. Further, the cells 11 may be a package including two or more cells.

The cell 11 of the fuel cell stack 12 has a terminal used for detection of the cell potential at the positive terminal thereof.

With reference to FIG. 3 will be described the cell voltage detecting system 2 in which the block 13n and the cell voltage detector 3n are described as a representative of the other blocks 13 and the cell voltage detectors 3.

The cell voltage detector 3n includes the voltage detector 90 and the diodes D1 and D2, an isolated DC-DC converter 40, and isolated communication devices 30 such as a photocoupler for transmitting transmission information Tx and receiving reception information Rx. Each of the isolated DC-DC converter 40 and the external power supply 50 serves as the auxiliary power supply 20 in the first embodiment.

The positive terminal $V_n^+$ (1, - - - n) of the voltage detector 90 is connected to the diode D1 in such a direction as to allow a current to flow from a positive terminal of the block 13, therein and to the diode D2 in such a direction as to allow a current to flow from a positive terminal $HV_n$ (1, - - - n) of the secondary side of the insulated DC-DC converter 40. A negative terminal $V_n^-$ of the voltage detector 90, a negative terminal of the block $13_n$, a negative terminal of the secondary side of the insulated DC-DC converter 40 are made at the same potential by, for example, connection. For example, in a block $13_n$, the negative terminal $V_n-$ (1, - - - n) of the voltage detector 90, the negative terminal of the block $13_n$, and the negative terminal of the secondary side of the insulated DC-DC converter 40 are connected to a ground $HG_n$.

An output voltage of the secondary side of the isolated DC-DC converter 40 ($HV_n$) is determined to be at least a minimum voltage necessary for driving the voltage detector 90 like the output voltage of the auxiliary power supply 20 described in the first embodiment (see FIG. 1). Further the output voltage $HV_n$ of the secondary side of the insulated type DC-DC converter 40 has extremely low voltage variation as compared with the output voltage of the block 13n.

Accordingly, either the output voltage of the block $13_n$ or the output voltage of the secondary side of the insulated DC-DC converter 40, having a higher voltage is supplied to the voltage detector 90 as the drive voltage of the voltage detector 90.

More specifically, the drive voltage for the voltage detector 90 is generally supplied by the fuel cell 10, but when the output voltage of the fuel cell 10 is temporarily lower than the minimum drive voltage, the drive voltage for the voltage detector 90 is supplied by the output voltage of the secondary side of the insulated DC-DC converter 40. In addition, the drive voltage for the voltage detector 90 is generally supplied by the output voltage of the secondary side of the DC-DC converter 40, when the fuel cell 10 starts up. In other words, the drive voltage for the voltage detector 90 is supplemented with the power from the auxiliary power supply 20. A primary side of the insulated DC-DC converter 40 is connected to the external power supply 50. A negative terminal of the external power supply 50 is connected to a ground LG of the cell voltage detecting system 2. Further, the output voltage of the secondary side of the insulated DC-DC converter 40 is determined to be a voltage equal to or higher than the drive voltage necessary for the voltage detector 90. The drive voltage for the voltage detector 90 in the second embodiment is approximately 5 V. Thus, if a battery of 12 voltage type is used as the external power supply 50, the insulated DC-DC converter requires no voltage booster. Accordingly, this structure can reduce the circuit size of the insulated DC-DC converter 40.

In the cell voltage detecting system 2, the cell voltage detectors 3 ($3_1$, $3_2$ - - -, $3_n$) are provided for respective blocks 13. The cell voltage detectors $3_1$ and $3_2$ are the same as the cell voltage detector 3n. The output voltage of the isolated DC-DC converter 40 is the same as that of the auxiliary power supply 20 described in the first embodiment. Further, the isolated DC-DC converters 40 are provided in the second embodiment. This structure allows the one external power supply 50 to supply the power to respective isolated DC-DC converters 40 although potentials of the negative terminals of respective blocks 13 are different from each other.

The information of the voltages detected by the voltage detectors 90 is transmitted to the isolated communication devices 30 to the CPU (not shown).

As mentioned above, generally, the minimum drive voltage for the voltage detector 90 is approximately 5 V in the cell voltage detecting system 2 according to the second embodiment, and if the output voltage of the external power supply 50 is 12V, a booster is not necessary. This makes the isolated DC-DC converter 40 compact. In other words, it is preferable that the minimum drive voltage of the voltage detector 90 is to be set to a lower voltage than 12 volts.

As mentioned above, the cell voltage detecting system according to the second embodiment, the drive voltage for the voltage detector 90 is supplied from either the output voltage of the fuel cell 10 or the output voltage of the auxiliary power supply 20 having a higher voltage by the diodes D1 and D2. Accordingly, the cell voltage detecting system 1 according to the second embodiment eliminates necessity of a determining circuit for determining decrease in the output voltage Vcell of the fuel cell. Thus, the circuit size of the cell voltage detecting system 1 according to the first embodiment can be made small. This suppresses the manufacturing cost.

Further, the negative terminal $V_n^-$ of the voltage detector 90, the negative terminal of the block 13, and the isolated DC-DC converter 40 are made to have the same potential for each block 13. This allows the number of the external power supplies 50 to be one. Thus, the circuit size of the cell voltage detecting system 2 can be made compact.

Further, the isolated DC-DC converter 40 may comprise a series regulator.

Regarding the method of maintaining a drive voltage disclosed in the first embodiment, the auxiliary power supply in the first embodiment is replaced with an external power supply 50 and the isolated DC-DC converter 40. The method further includes the step of determining that the output voltage of the auxiliary power supply is smaller than an output voltage of the external power supply 50.

The invention claimed is:

1. A cell voltage detecting system that detects voltages of cells in a fuel cell connected in series, comprising:
  a voltage detector that detects voltages of the cells and includes positive and negative drive terminals and comprises a multiplexer for selecting a positive terminal of one of the cells in the fuel cell to detect a potential of the selected positive terminal and applying the detected potential to a differential amplifier, wherein the differential amplifier calculates a voltage differential between the voltage potential of the selected positive terminal of the cell and a reference potential and multiplies the difference by a predetermined value;
  an auxiliary power supply that generates a voltage equal to or greater than a minimum voltage necessary for driving the voltage detector between positive and negative terminals thereof, wherein the auxiliary power supply comprises a DC-DC converter;
  a first diode connected to a positive terminal of the fuel cell and the positive drive terminal in such a direction as to allow a current to flow therethrough from the positive terminal of the fuel cell to the positive drive terminal; and
  a second diode connected to the positive terminal of the auxiliary power supply and the positive drive terminal in such a direction as to allow a current to flow therethrough from the positive terminal of the auxiliary power supply to the positive drive supply terminal,
  wherein the cells are divided into a plurality of blocks as the cells are connected in series, each block including a negative terminal;
  wherein a negative terminal of a last cell in series of the fuel cell, the negative drive terminal of the voltage detector, the negative terminal of the auxiliary power supply, a negative drive terminal of the multiplexer and the reference potential of the differential amplifier are connected to have a same potential;
  wherein the DC-DC converter comprises a plurality of isolated DC-DC converting devices that belong to respective blocks, each of the isolated DC-DC converting devices including primary and secondary sides isolated, including the negative terminal of the DC-DC converter on the secondary side, and generating the voltage between the positive and negative terminals on the secondary side;

wherein the voltage detector comprises a plurality of voltage detecting devices that belong to respective blocks, each detecting voltages of the cells in the block and including the positive and negative drive terminals, and wherein the negative terminal on the secondary side of the isolated DC-DC converting device, and the negative drive terminal of the voltage detecting device in the block are equalized to a potential of the negative terminal of the block, and the primary side in each block is connected to the auxiliary power supply.

2. The cell voltage detecting system as claimed in claim 1, wherein the auxiliary power supply further comprises an external power supply for generating an output voltage, and wherein the output voltage of the auxiliary power supply is smaller than an output voltage of the external power supply.

3. A method of maintaining a drive voltage for a cell voltage detector that detects voltages of cells in a fuel cell connected in series, using voltages of the fuel cell and an auxiliary power supply, wherein the auxiliary power supply comprises a DC-DC converter, wherein the voltage detector that detects voltages of the cells and includes positive and negative drive terminals, and wherein the voltage detector comprises a multiplexer for selecting a positive terminal of one of the cells in the fuel cell to detect a potential of the selected positive terminal and applying the detected potential to a differential amplifier, wherein the differential amplifier calculates a voltage differential between the voltage potential of the selected positive terminal of the cell and a reference potential and multiplies the difference by a predetermined value, the method comprising the steps of:

supplying the voltage of the fuel cell to the cell voltage detector when the voltage of the fuel cell is greater than the voltage of the auxiliary power supply;

supplying the voltage of the auxiliary power supply to the cell voltage detector when the voltage of the fuel cell is not greater than the voltage of the auxiliary power supply; and determining the voltage of the auxiliary power supply to be equal to or greater than a minimum voltage necessary for driving the voltage detector between positive and negative terminals thereof, wherein the DC-DC converter comprises a plurality of isolated DC-DC converting devices that belong to respective blocks, each of the isolated DC-DC converting devices including primary and secondary sides isolated, including the negative terminal of the DC-DC converter on the secondary side, and generating the voltage between the positive and negative terminals on the secondary side;

wherein the voltage detector comprises a plurality of voltage detecting devices that belong to respective blocks, each detecting voltages of the cells in the block and including the positive and negative drive terminals, and wherein the negative terminal on the secondary side of the isolated DC-DC converting device, and the negative drive terminal of the voltage detecting device in the block are equalized to a potential of the negative terminal of the block, and the primary side in each block is connected to the auxiliary power supply, and when an output voltage of the fuel cell is greater than the minimum voltage, supplying the voltage of the fuel cell to the voltage detector and when the voltage of the fuel cell is not greater than the minimum voltage, supplying the voltage of the auxiliary power supply to the voltage detector, comprising:

providing a first diode connected to a positive terminal of the fuel cell and a positive drive terminal of the voltage detector in such a direction as to allow a current to flow therethrough from the positive terminal of the fuel cell to the positive drive terminal of the voltage detector;

providing a second diode connected to the positive terminal of the auxiliary power supply and the positive drive terminal in such a direction so as to allow a current to flow therethrough from the positive terminal of the auxiliary power supply to the positive drive terminal; and connecting a negative terminal of a last cell in series of the fuel cell, a negative drive terminal of the voltage detector, a negative terminal of the auxiliary power supply, a negative drive terminal of the multiplexer and the reference potential of the differential amplifier to each other to have a same potential.

4. The method as claimed in claim 3, further comprising the steps of:

(a) determining the voltage of the auxiliary power supply to be equal to or greater than a minimum voltage necessary for driving the voltage detector between positive and negative terminals thereof; and (b) when an output voltage of the fuel cell is greater than the minimum voltage, supplying the voltage of the fuel cell to the voltage detector and when the voltage of the fuel cell is not greater than the minimum voltage, supplying the voltage of the auxiliary power supply to the voltage detector.

5. The method of maintaining a drive voltage as claimed in claim 4, wherein the step (b) comprising the steps of:

providing a first diode connected to a positive terminal of the fuel cell and a positive drive terminal of the voltage detector in such a direction as to allow a current to flow therethrough from the positive terminal of the fuel cell to the positive drive terminal of the voltage detector; and a second diode connected to the positive terminal of the auxiliary power supply and the positive drive terminal in such a direction as to allow a current to flow therethrough from the positive terminal of the auxiliary power supply to the positive drive supply terminal; and connecting a negative terminal of the fuel cell, a negative drive terminal of the voltage detector, and a negative terminal of the auxiliary power supply each other to have a same potential.

6. The method of maintaining a drive voltage as claimed in claim 4, wherein the auxiliary power supply comprises an external power supply for generating an output voltage and a DC-DC converter, the method further comprising the step of determining that the output voltage of the auxiliary power supply is smaller than an output voltage of the external power supply.

* * * * *